United States Patent
Lee et al.

(10) Patent No.: US 6,906,712 B2
(45) Date of Patent: Jun. 14, 2005

(54) AUTOMATED THREE-DIMENSIONAL ALTERNATIVE POSITION VIEWER

(75) Inventors: Kyeong Hwi Lee, Lexington, MA (US); Marc Joel Leizza, Saugus, MA (US); Boris C. Shoov, Nashua, NH (US); Robert P. Zuffante, Concord, MA (US)

(73) Assignee: SolidWorks Corporation, Concord, MA (US)

( * ) Notice: Subject to any disclaimer, the term of this patent is extended or adjusted under 35 U.S.C. 154(b) by 422 days.

(21) Appl. No.: 09/924,294

(22) Filed: Aug. 8, 2001

(65) Prior Publication Data

US 2002/0089499 A1 Jul. 11, 2002

Related U.S. Application Data

(60) Provisional application No. 60/250,312, filed on Nov. 30, 2000.

(51) Int. Cl.[7] .............................................. G06T 17/00
(52) U.S. Cl. ..................................................... 345/420
(58) Field of Search ................................ 345/419, 420, 345/619, 625, 630, 653, 920, 964, 646, 473, 629

(56) References Cited

U.S. PATENT DOCUMENTS 5,729,704 A * 3/1998 Stone et al. ................. 345/804
5,815,154 A * 9/1998 Hirschtick et al. .......... 715/853
6,219,049 B1   4/2001 Zuffante et al. ............. 345/339
6,219,055 B1 * 4/2001 Bhargava et al. ........... 715/850
6,473,081 B1 * 10/2002 Silva et al. .................. 345/420
6,559,860 B1 * 5/2003 Hamilton et al. ........... 345/700
6,611,725 B1 * 8/2003 Harrison et al. .............. 700/98

OTHER PUBLICATIONS

French et al., Mechanical Drawing, Copyright 1962, pps. 470–471.

Giachino et al., Drafting Technology, Copyright 1964, pps. 40–42.

* cited by examiner

Primary Examiner—Mark Zimmerman
Assistant Examiner—Scott Wallace
(74) Attorney, Agent, or Firm—James V. Mahon; Clifford Chance US LLP

(57) ABSTRACT

Computer-implemented method and apparatus for processing data representing a three-dimensional object model includes generating an image of a modeled object. The modeled object is formed from a number of different components that can be arranged in different positions, and the generated image depicts a change in a position of a first one of the components with respect to a second one of the components.

24 Claims, 15 Drawing Sheets

AUTOMATED THREE-DIMENSIONAL ALTERNATIVE POSITION VIEWER

This application claims the benefit of the filing date of U.S. provisional application Ser. No. 60/250,312 entitled "Automated Three-Dimensional Alternative Position Viewer" which was filed on Nov. 30, 2000.

BACKGROUND OF THE INVENTION

Computer-aided design (CAD) software allows a user to construct and manipulate complex three-dimensional (3D) models of assembly designs. A number of different modeling techniques can be used to create the 3D assembly models. These techniques include solid modeling, wire-frame modeling, and surface modeling. Solid modeling techniques provide for topological 3D models, where the 3D model is a collection of interconnected edges and faces, for example. Geometrically, a 3D solid model is a collection of trimmed surfaces. The trimmed surfaces correspond to the topological faces bounded by the edges. Wire-frame modeling techniques, on the other hand, can be used to represent a model as a collection of simple 3D lines, whereas surface modeling can be used to represent a model as a collection of exterior surfaces. CAD systems may combine these, and other, modeling techniques. For example, parametric modeling techniques can be used to define various parameters for different components of a model and to define relationships between those components based on relationships between the various parameters. Solid modeling and parametric modeling can be combined in CAD systems to support parametric solid modeling.

In addition to supporting 3D objects, CAD systems may support two-dimensional (2D) objects. Whereas 3D representations of a model are commonly used to manipulate the model in three-space and visualize the model from different viewpoints, 2D representations of the model are generally used to formally document the design of a model. Two-dimensional drawings are typically created by a draftsman and given to a manufacturing engineer, and may serve as the basis of a design specification.

In the engineering field, CAD systems with 3D capabilities may also provide for orthographic 2D views of the left, right, top, bottom, front, and back sides of a model. These CAD systems may display more than one view of the model simultaneously on the system's cathode ray tube (CRT), with each view of the model appearing in a separate area of the CRT known as a drawing view area. For example, a CAD system may display a left view of a model in one drawing view area and a front view of a model in a second drawing view area on the CRT.

Engineers specialize in different phases of the design-to-manufacturing process, and therefore, acquire different modeling and design skills. Engineers employ particular modeling techniques depending on which aspects and representations of a model require their attention. In general, a design engineer deals with designing physical and aesthetic aspects of 3D models, and is skilled in 3D modeling techniques; whereas, a draftsman prepares formal 2D drawings that a manufacturing engineer may use to build the model, and therefore, is skilled in 2D rendering techniques.

The same individual may be responsible for designing a 3D model as well as formally documenting that model in 2D, and thus, the individual must be skilled in 3D modeling as well as drafting. Often, however, the design engineer and the draftsman are different individuals, both of whom require access to the same CAD model.

Part assemblies are not always static, so draftsmen need a mechanism for displaying alternative positions of an assembly model. Ideally, the alternative positions would be displayed in a single drawing view area. One position of the model may be overlaid on a second position of the model, thereby enabling a draftsman to easily visualize the model in motion and enabling a manufacturing engineer to do the same. Rendering alternative positions helps the draftsman and manufacturing engineer understand the degrees of freedom designed into the model (e.g., which parts of a model can move, how far the parts can move, and in which directions the parts can move due to the model's documented constraints).

Generally, CAD systems provide two methods for presenting alternative positions in the same drawing view area. Using the first method, the draftsman employs the 2D drawing capabilities of a CAD system to manually sketch assembly components that assume multiple positions a multiple number of times, once in each position that the draftsman needs to document. Manually drawing the same components in different positions is also the technique used to draw assemblies without the benefit of a CAD system. Re-drawing the same components is tedious because the method is not automated.

Using the second method to present alternative positions, a draftsman specifies one or more 2D transformations to apply to a group of sketched entities, then issues a command to the CAD system to apply the 2D transformations to the group, thereby copying the group of sketched entities to the alternative position. Only sketched entities that are repositioned by applying the same 2D transformations can be grouped together. Therefore, a draftsman may need to create several groups of moveable sketched entities and instruct the system to transform each group one at a time.

This second method can only be used when parts are transformed in two dimensions because a 2D CAD system, (or a 2D software module used for drafting functions), can only transform parts in two dimensions (e.g., in the x-y plane). If 3D transformations are necessary to illustrate assembly motion, the draftsman may need to manually sketch, in the 2D-drafting environment, each assembly component that needs to be transformed in three dimensions in order to portray the 3D motion in a two dimensions.

Both methods require the draftsman to improve the appearance of the drawing. For example, hidden lines must be manually removed in the areas where parts overlap. Additionally, line fonts must be manually changed to the "phantom" line font (in accordance with the industry standard), to distinguish the transformed parts.

State of the art 3D CAD applications, (such as Solid-Works 2000, available from SolidWorks Corporation of Concord, Mass.), allow a user to create one or more 3D configurations of an assembly during the modeling process. The purpose of creating 3D configurations is to allow the design engineer to represent a set of features and parameters for the same model (e.g., a set of features and parameters that modify a shape of an assembly component or a set of features and parameters that specify various part sizes). A 3D configuration cannot be created during the drafting process and the drafting software module is only capable of displaying one configuration per drawing view area. To display alternative positions, one configuration may be created to simulate an overlaid view of the alternative positions. This is accomplished during the 3D-modeling process by first constructing the initial position of the assembly and establishing constraints between the appropriate components, then reconstructing or making a copy of the moveable components in one or more alternative positions and repeating the operations that establish constraints between the appropriate components. During the 2D-drafting process, the draftsman must manually change the line fonts to the "phantom" line font for those components redrawn in an alternative position, thereby conforming to the industry standard for distinguishing alternative positions.

One problem with providing a general solution for creating 3D alternative positions during the 2D-drafting process is caused by the interconnections and dependencies of various components in the assembly. One component may move in the 2D x-y plane. The reaction of a second component that is attached to the first component may be to move with respect to a plane other than the 2D x-y plane. A 2D-drafting module cannot reconcile the 3D movement.

Another problem with providing a general solution for creating 3D alternative positions during the drafting process is designing a smooth transition between the 2D-drafting process and 3D-modeling process. The draftsman, skilled in 2D-drafting techniques, should not be burdened with the necessity of understanding 3D-modeling techniques used by a design engineer. Nor should the draftsman be burdened with the need to acquire the 3D-modeling skills required of a design engineer. The draftsman should be allowed to focus on the task at hand, that is, creating formal drawings.

SUMMARY OF THE INVENTION

In general, in one aspect, the invention features a computer-implemented method of processing data representing a three-dimensional object model. The processing includes generating an image of a modeled object. The modeled object is formed from a number of different components that can be arranged in different positions, and the generated image depicts a change in a position of a first one of the components with respect to a second one of the components.

Implementations may include one or more of the following features. Generating the image can include traversing a data structure representing a hierarchy of model components (a "model hierarchy") to render an image of the modeled object. The model hierarchy may identify an interrelationship between model components, and also may identify different positional arrangements of the model components with respect to each other. The image can use different display attributes (e.g., color, line weight, and solid and dashed line types) to indicate a component in different positions.

In general, in another aspect, the invention features a computer-implemented method of processing data representing a three-dimensional object model. The method includes traversing a hierarchy of components of the object model to render a first and a second view of a model such that the second view shows the components in a different positional arrangement with respect to each other. The first and second views are combined to display a composite image of the model showing different positions of the model components. The model hierarchy can also include dimension datum used to annotate the image of the modeled object. Different positions of the modeled components may be represented by a three-dimensional transformation stored in the model hierarchy and applied to the model components during image generation.

Various aspect of the invention may be implemented in computer systems that include a data storage system for the model data, a computer processor coupled to the model data storage system, a program storage system (which may be the same as the model data storage system), and an output display system. The program storage system can include instructions to configure the processor to perform method processes disclosed herein.

The details of one or more embodiments of the invention are set forth in the accompanying drawings and the description below. Implementations may provide advantages such as the ability to easily generate images showing model components in different positions. Other features, objects, and advantages of the invention will be apparent from the description and drawings, and from the claims.

DETAILED DESCRIPTION OF THE INVENTION

Many assembly structures assume multiple positions. For example, one or more components (i.e., parts or subassemblies) in an assembly may have opened and closed positions, or start and stop positions. Additionally, dynamic assembly structures may consist of one or more moveable parts that exhibit continuous motion; thus, the arrangement of parts is constantly changing.

During the 2D-drafting phase of designing an assembly, a draftsman constructs a formal 2D drawing of the assembly. The draftsman may find it necessary to document an alternative position to completely specify the design in the form of a 2D drawing, and may wish to draw and annotate the multiple positions in a single drawing view. Additionally, the draftsman may wish to draw a position that was not created by a design engineer in the modeling phase of the design process.

An automated 3D alternative position viewer provides the necessary software tools to enable a draftsman to render and annotate multiple 3D positions of an assembly in a single 2D drawing view area. The software tools enable the draftsman to create 3D positions during the drafting stage of product design, as required, without the draftsman needing the expertise of a 3D design engineer. The automated 3D alternative position viewer can immediately project the newly created 3D position into a 2D drawing view that contains another position, thereby overlaying the newly created 3D position on an existing position. Furthermore, dimensions may be added between different positions that are displayed. By allowing the draftsman to produce and display dynamic 3D characteristics of an assembly structure while in the 2D-drafting phase of assembly design, the automated 3D alternative position viewer enhances the flexibility and functionality of a computerized modeling system.

Figure 1:
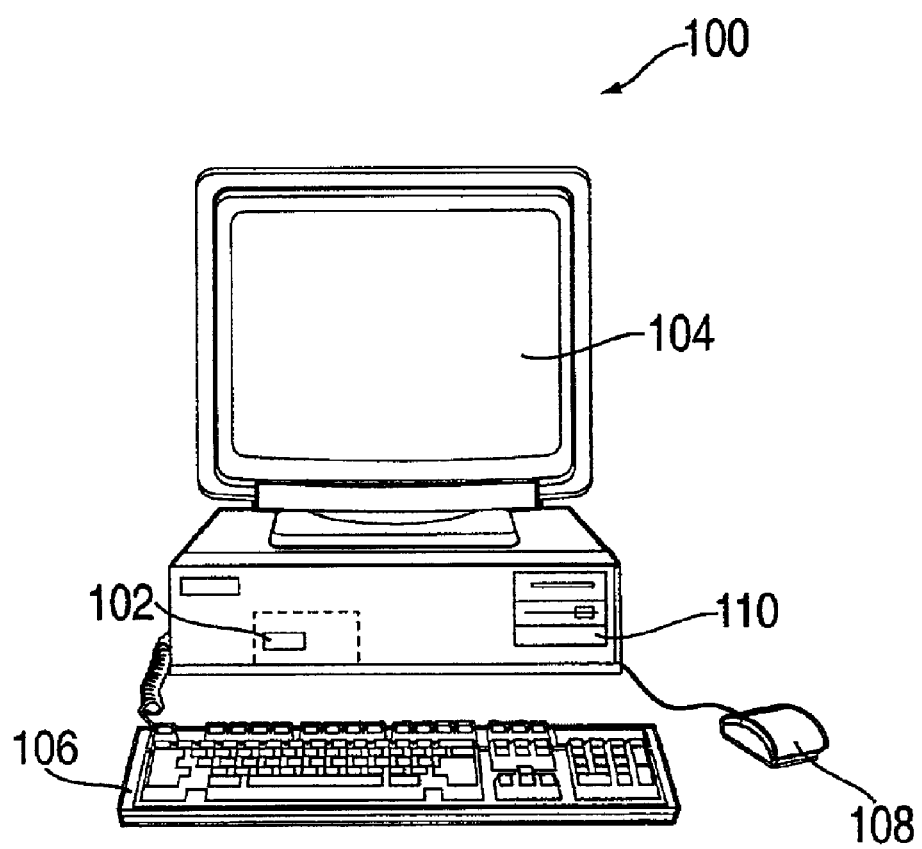
FIG. 1 is a diagram of a computer system.

FIG. 1 shows a computerized modeling system 100 that includes a CPU 102, a CRT 104, a keyboard input device 106, a mouse input device 108, and a storage device 110. The CPU 102, CRT 104, keyboard 106, mouse 108, and storage device 110 can include commonly available computer hardware devices. For example, the CPU 102 can include a Pentium-based processor. The mouse 108 has conventional left and right buttons that the user may press to issue a command to a software program being executed by the CPU 102. Other appropriate computer hardware platforms are suitable as will become apparent from the discussion that follows. Such computer hardware platforms are preferably capable of operating the Microsoft Window NT, Windows 95, Windows 98, Windows 2000, or UNIX operating systems.

Computer-aided design software is stored on the storage device 110 and is loaded into and executed by the CPU 102. The software allows the user to create and modify a 2D or 3D model and implements aspects of the invention described herein. The CPU 102 uses the CRT 104 to display a 2D or a 3D model and other aspects thereof as described later in more detail. Using the keyboard 106 and the mouse 108, a user can enter and modify data for the 2D or 3D model. The CPU 102 accepts and processes input from the keyboard 106 and the mouse 108. The CPU 102 processes the input along with the data associated with the 2D or 3D model and makes corresponding and appropriate changes to that which is displayed on the CRT 104 as commanded by the modeling software. Those of ordinary skill in the art will appreciate that the invention could also be used in conjunction with other computer-aided design software that addresses applications other than mechanical design.

Figure 2:
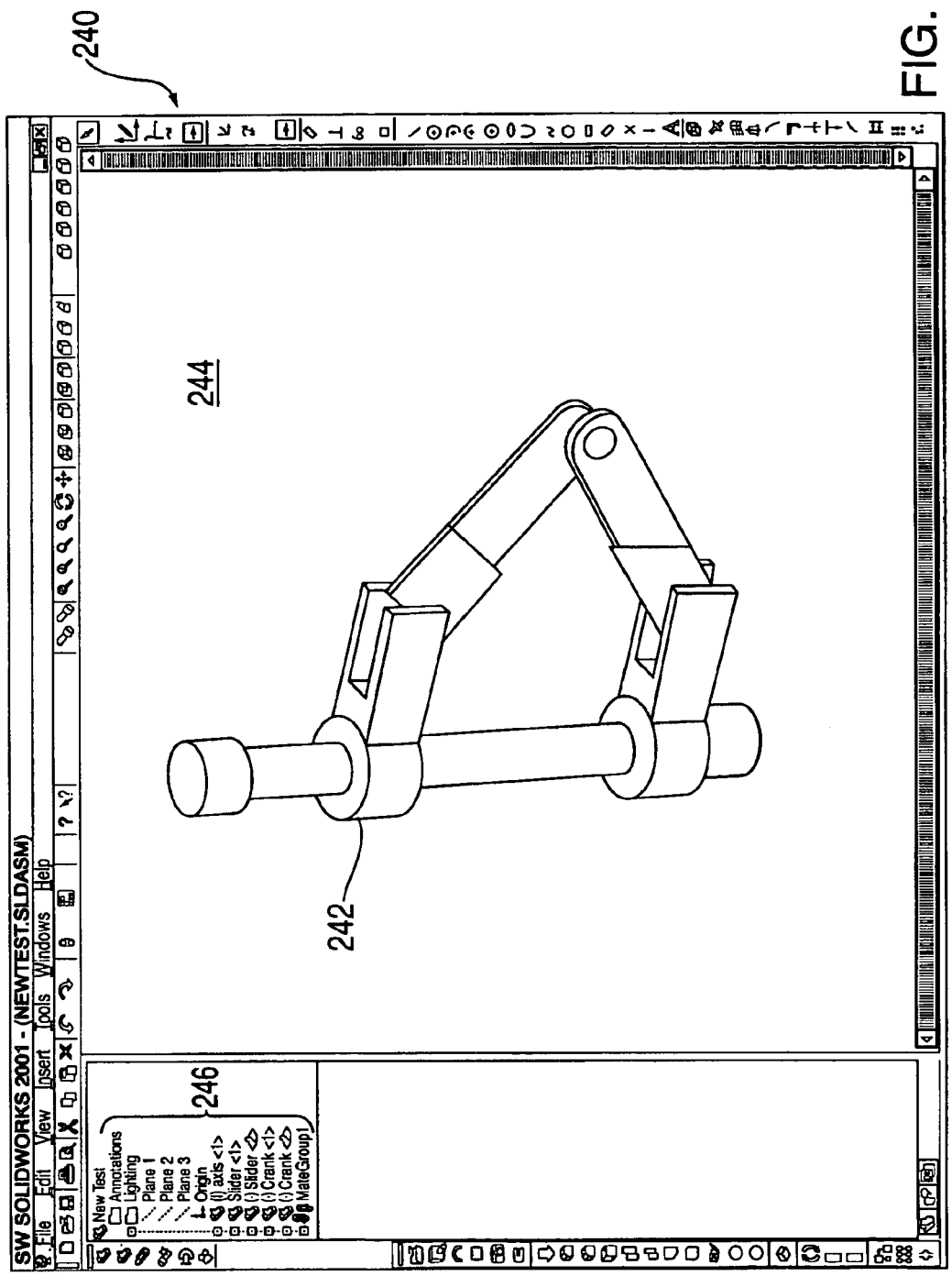
FIG. 2 is an illustration of an image on the CRT.

Referring to FIG. 2, an image on the CRT 104 is shown in detail and includes a window 240. The window 240 is a conventional computer-generated window that can be programmed by one of ordinary skill in the art using conventional, commercially available, software programming tools, such as those available from Microsoft Corporation of Redmond, Wash.

A computer-generated 3D model 242 is displayed within a modeling portion 244 of the window 240. The user can construct and modify the 3D model 242 in a conventional manner. The surfaces of the 3D model 242 can be displayed, or the 3D model 242 can be displayed using solid lines and dashed lines to show visible edges and hidden edges, respectively, of the 3D model. Implementations also may include other window areas, such as a feature manager design tree 246, which helps the user visualize and manipulate the model 242 shown in the modeling portion 244 of the window 240.

Figure 3:
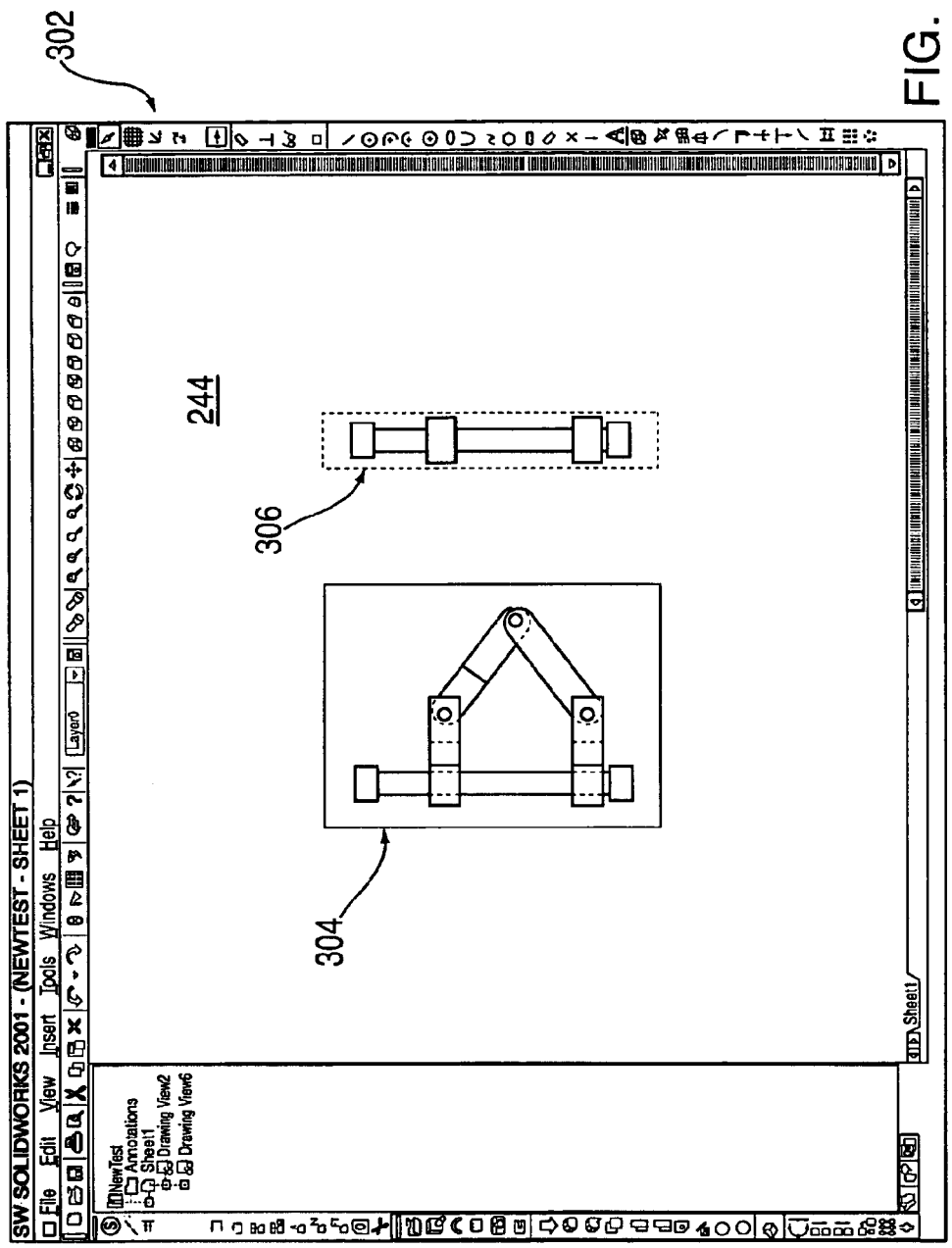
FIG. 3 is an illustration of 2D views of a model.

Referring to FIG. 3, the modeling portion 244 may also display a 2D representation of a 3D model. The 2D representation is useful for preparing engineering drawings that formally document a design and often include annotations such as the dimensions of and between various parts. Commonly, a user displays one 2D drawing view area beside another 2D drawing view area to illustrate different sides of a 3D model. For example, as shown in FIG. 3, a window 302 contains a front view 304 of the 3D model and a left view 306 of the 3D model in separate drawing view areas.

A modeling system may have the capability of retaining the designer's original design intent as a model undergoes modifications before the model design is complete. A parametric modeling system (or parametric solid modeling system), ensures that certain aspects of the designer's intent are retained. Those of ordinary skill in the art will appreciate how to design a parametric modeling system.

In one embodiment, the underlying data structures behave parametrically. For example, the geometry, display attributes, and annotations in a drawing view area are updated as needed when a design engineer changes the model. Thus, if a vertex of an object is moved and an annotation having an arrow and a leader points to the vertex of the object, the annotation will move accordingly. Dimensions also behave parametrically. For example, a change in an underlying model may affect a dimension displayed in a drawing view area. The dimension will then be updated as needed, including the location of the dimension and the dimension value.

In one embodiment, the modeling system is a solid modeling system. The model is an assembly of solid model components. The solid model may have relationships that constrain the positions of one or more components with respect to one another. If a constrained relationship exists between two components, changing a position of one component may change the position of the other component. For example, one component may slide down a shaft and cause a connecting component to rotate about a pivotal link.

Using a 3D modeling system such as SolidWorks 2000, the design engineer can construct an initial configuration of an assembly, then construct one or more additional configurations of the assembly. The configurations are data structures that are defined in terms of components in a reference model and a set of parameters and features that vary from one configuration to another configuration. One method that may be used to create alternative 3D positions is to enhance the configuration data structure to accommodate transformations that apply to particular components.

An automated 3D alternative position viewer allows a draftsman to render the initial position of the assembly and one or more alternative positions of the assembly in the same 2D drawing view area. The initial and alternative positions may represent extreme positions of components in the assembly or the initial and alternative positions may represent various states an assembly may exhibit. Additionally, the draftsman can create new 3D positions, as needed, while in the process of creating a formal drawing in the 2D-drafting environment.

Figure 4:
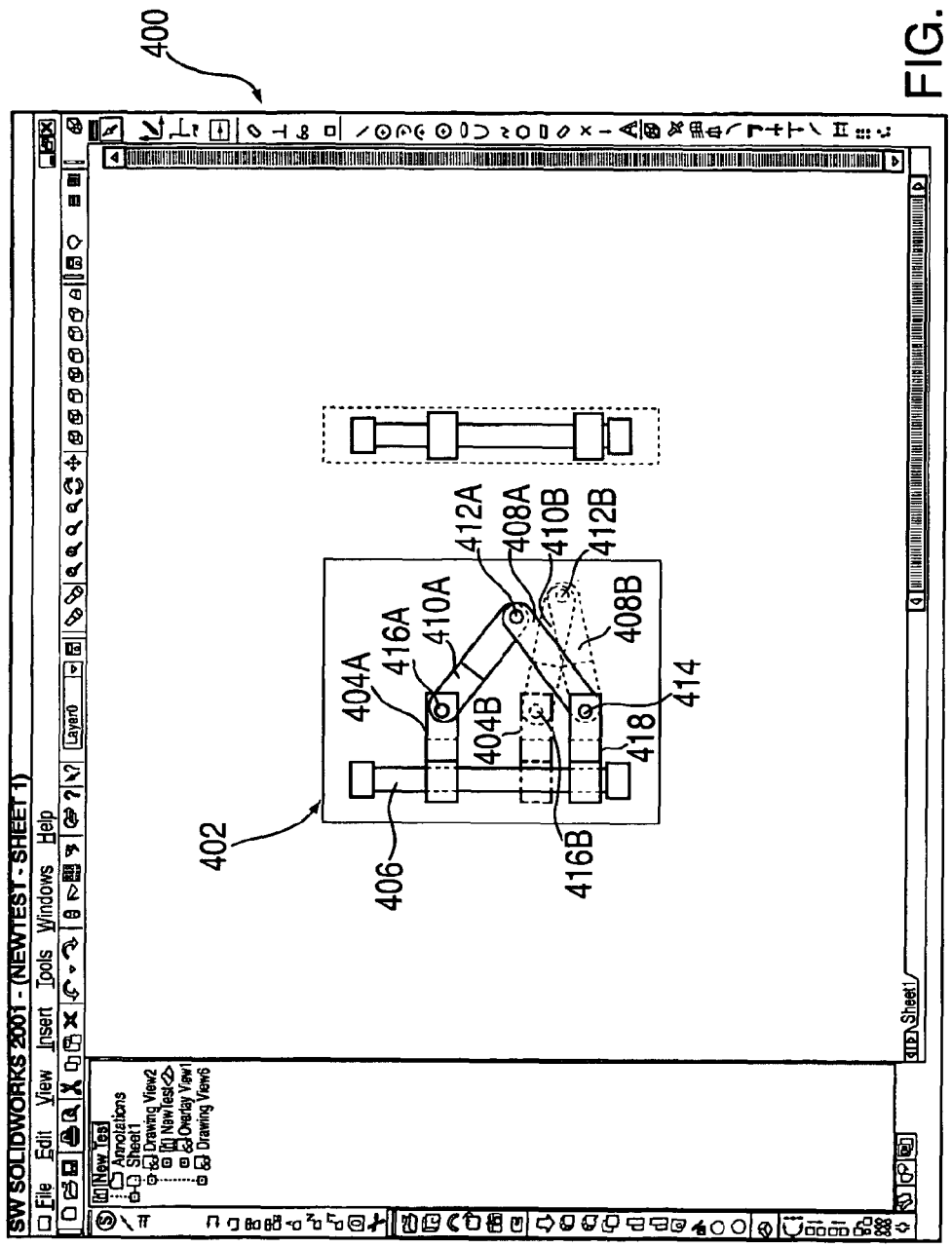
FIG. 4 is an illustration of multiple positions of a model.

FIG. 4 is an illustration of a window 400 having a drawing view area 402 that shows a unified image of a dynamic assembly having a set of components that are simultaneously shown in two different positional arrangements. The initial position of the upper slider 404a on the shaft 406 can move to the extreme position of the upper slider 404b. As the upper slider 404a/404b moves, the initial position of the lower arm 408a and the initial position of the upper arm 410a rotate about the pivotal link 412a/412b, the pivotal link 414, and the pivotal link 416a/416b.

As previously discussed, a solid model may have relationships that constrain the position of one component with respect to the position of another component. In the assembly illustrated in FIG. 4, a constrained relationship exists between the lower slider 418 and the lower arm 408a/408b. The constrained relationship serves the purpose of keeping the lower slider 418 and the lower arm 408a/408b joined at the pivotal link 414 as the assembly moves through the entire range of motion of which it is capable. Additionally, constrained relationships are defined between the lower arm 408a/408b and the upper arm 410a/410b, joining the arms at the pivotal link 412a/412b, and between the upper slider 404a /404b and upper arm 410a/410b, joining the upper slider 404a /404b and upper arm 410a/410b at the pivotal link 416a/416b.

Figure 5:
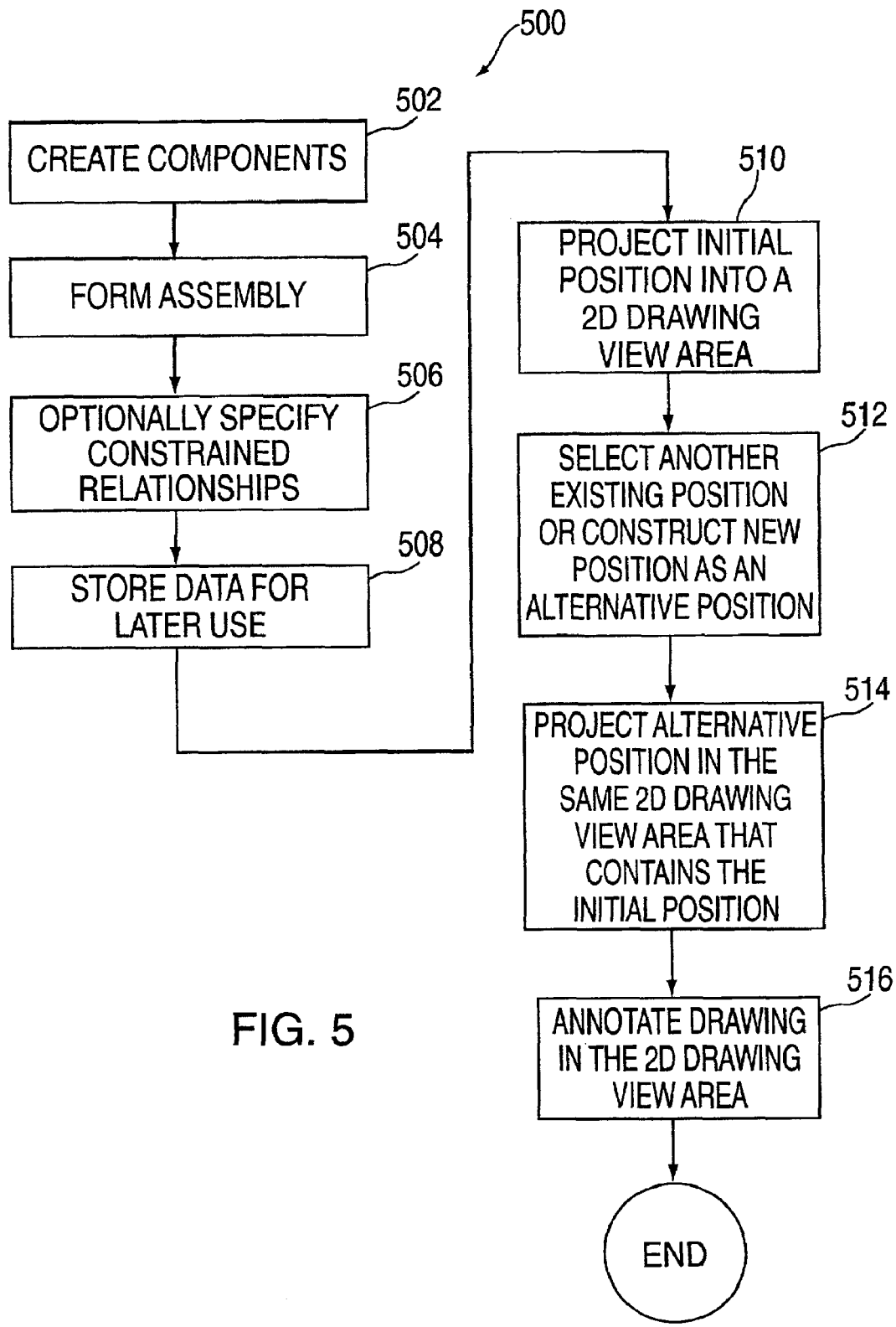
FIG. 5 is a flow chart of steps that display alternative positions.

Referring to FIG. 5, a flow chart 500 shows a procedure for displaying 3D alternative positions in a single 2D drawing view area. One person performing both design and drafting functions may execute the procedure. Alternatively, two people may execute the procedure, where one person is performing design functions and the other person is performing drafting functions.

First, a design engineer creates components (step 502), using the commands made available by the modeling system. The design engineer then forms an assembly (step 504) from a set of components, by specifying which components belong in the assembly. Optionally, the design engineer may specify constrained relationships between one or more components (step 506). The design engineer stores the data that defines the model, which the draftsman can access at a later time (step 508). The data that defines the model may include a data structure that specifies a configuration for an initial position of the assembly.

After the design engineer constructs and stores the initial position of the assembly, and possibly, creates and stores additional positions, the draftsman can access the positions to begin formally documenting the assembly. The draftsman may first command the system to project the initial position into a 2D drawing view area (step 510). The draftsman then selects another position that exists or constructs a new position, which will later be discussed in more detail. The existing position or the new position will become an alternative position (step 512). If the desired position exists, for example, because a design engineer had previously created the position, the draftsman simply identifies the existing position by way of the user interface. If the desired position does not exist, a new position may be easily produced automatically using one or more modeling techniques, including moving one or more components in three-dimensional space by dragging the components to a new location using a mouse device or by entering a new set of parameters.

In one embodiment, modeling techniques that produce alternative positions of one or more assembly components cause the system to construct configuration data structures. A configuration data structure that specifies a new position is created by copying the configuration data structure that specified the initial position, then adding or modifying transformations in the configuration data structure that apply to particular components.

After the draftsman specifies an alternative position by selecting another existing position or using a modeling technique to produce a new position, the system automatically projects the alternative position into the 2D drawing view area that contains the initial position of the assembly (step 514). The draftsman then may annotate the drawing in the 2D drawing view area (step 516). Annotating a drawing includes fully dimensioning the assembly, adding the necessary and correct tolerances, and specifying the surface finish and material of one or more parts, among other information that the manufacturing engineer requires to build the assembly.

Figure 6:
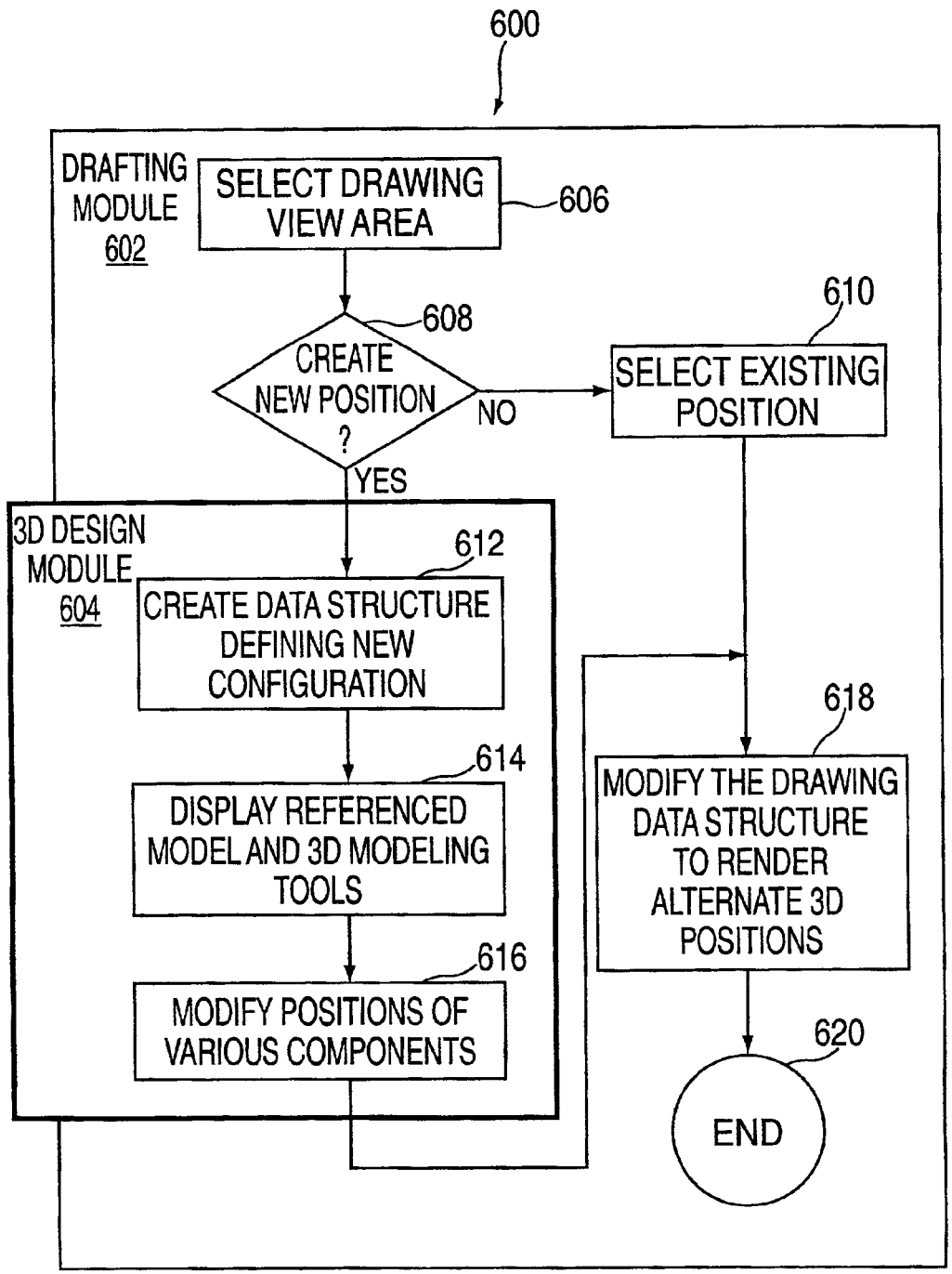
FIG. 6 is a flow chart of steps that determine an alternative position.

Referring to FIG. 6, a flow chart 600 illustrates a procedure that selects or constructs an alternative 3D position, which is displayed in the same drawing view area as another position. Initially, the drafting module 602 is the active software module. However, the draftsman can create a new 3D position of a model because the drafting module 602 can transfer control to the 3D-design module 604. Control is transferred for the specific task of manipulating the model in three dimensions and generating a new configuration of the assembly. Transferring control to the 3D-design module 604 may be transparent to the draftsman. For example, the 3D operations necessary to create a 3D alternative position, which will be discussed, may be available in the 2D-drafting window. Furthermore, the model may undergo 3D transformations that are projected in real-time in the 2D-drafting window.

When a draftsman decides to render 3D alternative positions, the draftsman may first select a drawing view area that contains a model (step 606), which not only serves to specify an area in which to render the new position, but also serves to reference the model that will have a new position. The system determines which model to reference by reading the reference model pointer contained in the data structure that defines the drawing view.

In the next step, the draftsman indicates whether to create a new position in the drawing view area or whether to use an existing position (step 608). This step may be implemented in several ways. The system may automatically query the draftsman by displaying a modal dialog box, which requires a response to continue, or the draftsman may make a menu selection to indicate that a new position is desired. If the draftsman chooses not to create a new position, an alternative position may be selected from a set of existing positions for the chosen model (step 610). The selection procedure may be implemented by displaying a dialog box that contains a list of all existing positions for the referenced model and allowing the draftsman to make a selection from the list. After selecting an existing position, the system modifies the data structure that defines the drawing to allow multiple 3D positions to be rendered in the same drawing view area (step 618) and the process that selects or constructs an alternative position 600 completes (step 620).

If the draftsman indicates that a new position is desired, control is transferred automatically to the 3D-design module 604 from the 2D-drafting module 602. The 3D design module 604 generates the appropriate data structures, including a data structure that defines a new configuration (step 612). The 3D-design module 604 displays the referenced model and 3D modeling tools (step 614). Using the 3D modeling tools, the draftsman may then modify positions of various components (step 616).

In one embodiment, the 3D modeling tools that the draftsman may use to modify a model's position is presented in a user interface panel, as later described in more detail. The draftsman uses one or more available 3D modeling tools to modify a model's position, and when satisfied with the position, presses a user interface control button to inform the system that the new position is acceptable. At that time, the system completes the definition of the new configuration, which includes completing the generation of the new data structure, and returns control to the 2D-drafting module 602.

The system automatically projects the new position into the 2D drawing view area. However, first the data structure that defines the drawing must accommodate the new configuration. The system modifies the drawing's data structure to allow multiple 3D configurations to be rendered in the same drawing view area and to enable the displayed positions to share common attributes and behavioral characteristics (step 618). The process that selects or constructs an alternative position 600 then completes (step 620).

Figure 7:
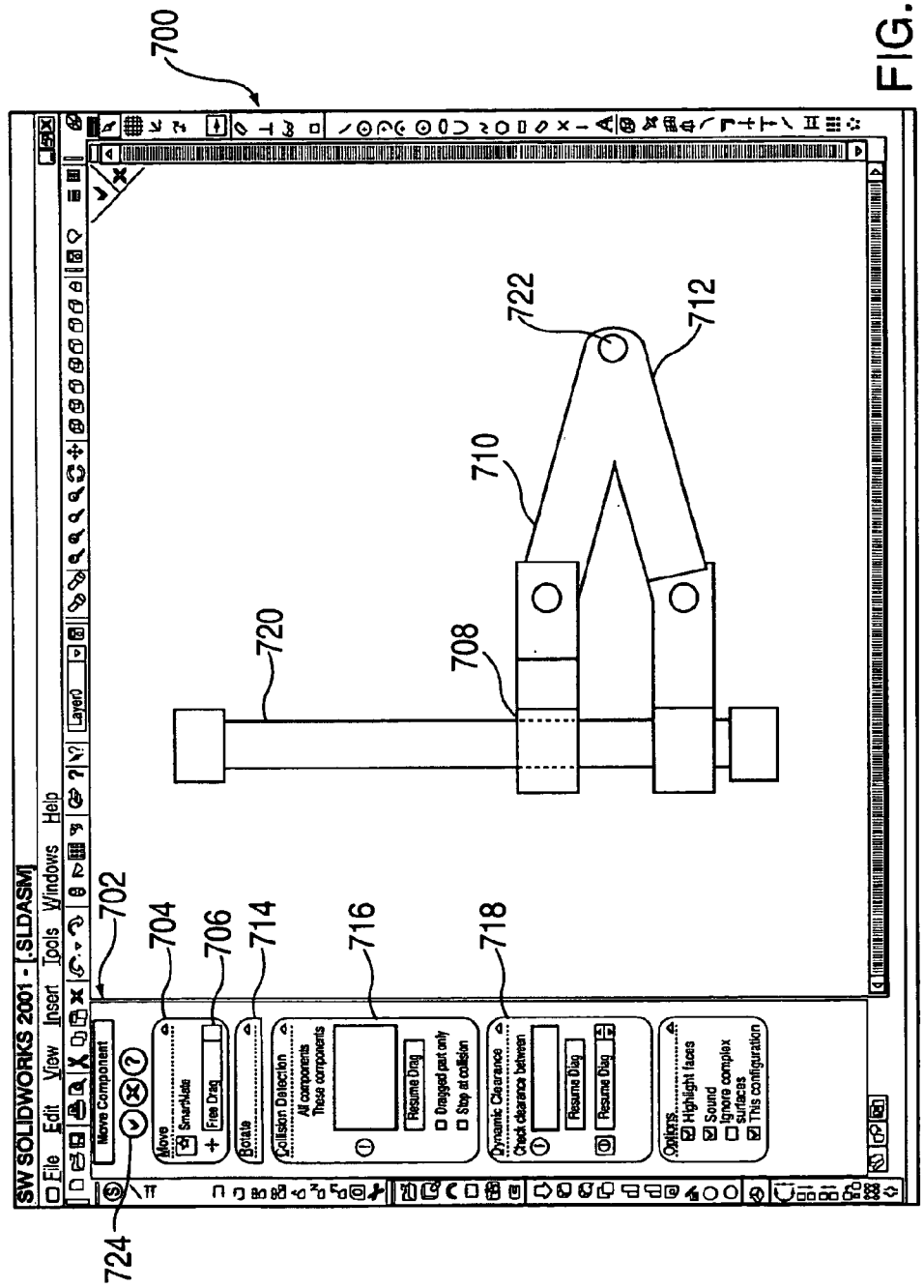
FIG. 7 is an illustration of a 3D-modeling window.

FIG. 7 shows the contents of a window 700 when control is first transferred to the 3D-design module 604. A user interface panel 702 presents a number of methods that may be used to modify the positions of components. The methods include moving a component, rotating a component, executing a collision detection process, and executing a dynamic clearance process.

The Move dialog 704 provides an interface, via a pull-down option menu 706, to 3D functions that translate a component. One item that may be selected from the pull-down option menu 706 initiates a drag operation, whereby a selected component may be translated by dragging the component using the mouse device. As the component is dragged, other components directly or indirectly joined to the selected component may also move in a physically appropriate manner prescribed by the design.

The constrained relationships designed into the assembly by the design engineer dictate the movement of the components. For example, the draftsman may select and then drag the upper slider 708 up or down the shaft 720 by moving the mouse device in the appropriate direction. At the same time, the upper arm 710, connected to the upper slider 708, undergoes a rotational motion centered at pin 722, as does the lower arm 712.

Other translation functions that may be selected from the pull-down option menu 706 include moving a component to a specific 3D location in three-dimensional space, moving a component along a specified 3D path, and moving a component by a specified incremental amount.

The Rotate dialog 714, shown in a collapsed state, is used to command the system to rotate a selected component. Among other techniques that cause a component to rotate, the draftsman may drag a selected component along the path of an arc or specify an incremental amount in which to rotate a component.

The Collision Detection dialog 716 executes a collision detection process, whereas, the Dynamic Clearance dialog 718 executes a process that monitors the distance between components. These dynamic processes manipulate components in a manner consistent with the constraints defined by the design engineer and help identify extreme positions of the assembly components. The collision detection and dynamic clearance processes use constraint management software capable of solving simultaneous equations, such as component products available from D-Cubed Limited of Cambridge, England.

A collision detection process analyzes whether and when components collide or are prevented from moving. Selected settings in the Collision Detection dialog 716 are passed as input parameters (or objects in a C++ program), to the collision detection process. The draftsman may choose to stop the collision detection process when a collision between components is detected. Upon the occurrence of a collision event the draftsman may choose to automatically generate a new configuration.

The Dynamic Clearance dialog 718 provides a means for the draftsman to input data to a clearance detection process. The draftsman can specify which components to monitor during the clearance detection process and can specify a minimum clearance value between the components that were specified. If the distance between the components is less than the minimum clearance value, the draftsman is notified (e.g., by outputting a sound or displaying a visual cue). The draftsman may also choose to have the system automatically generate a new configuration when the minimum clearance value is reached.

The user interface panel 702 contains check boxes for various options, a button to command the system to ignore the last operation, and a button to command the system to display help messages. When the checkmark button 724 is pressed, the configuration is saved. At this time, referring back to FIG. 6, control returns to the 2D-drafting module 602, the drawing data structure is updated (step 618), and the configuration is automatically projected in the current 2D drawing view area.

In one embodiment, the underlying data structure that supports automated 3D alternative positions is hierarchical. A hierarchical data structure is a tree structure that has parent and child relationships between the various nodes in the tree. A child inherits properties and characteristics from its parent and all ancestor nodes. A programmer, skilled in the art of computer programming, understands how to create a hierarchical data structure and how to arrange the nodes so they derive the appropriate properties and characteristics from other nodes in the data structure.

Figure 8:
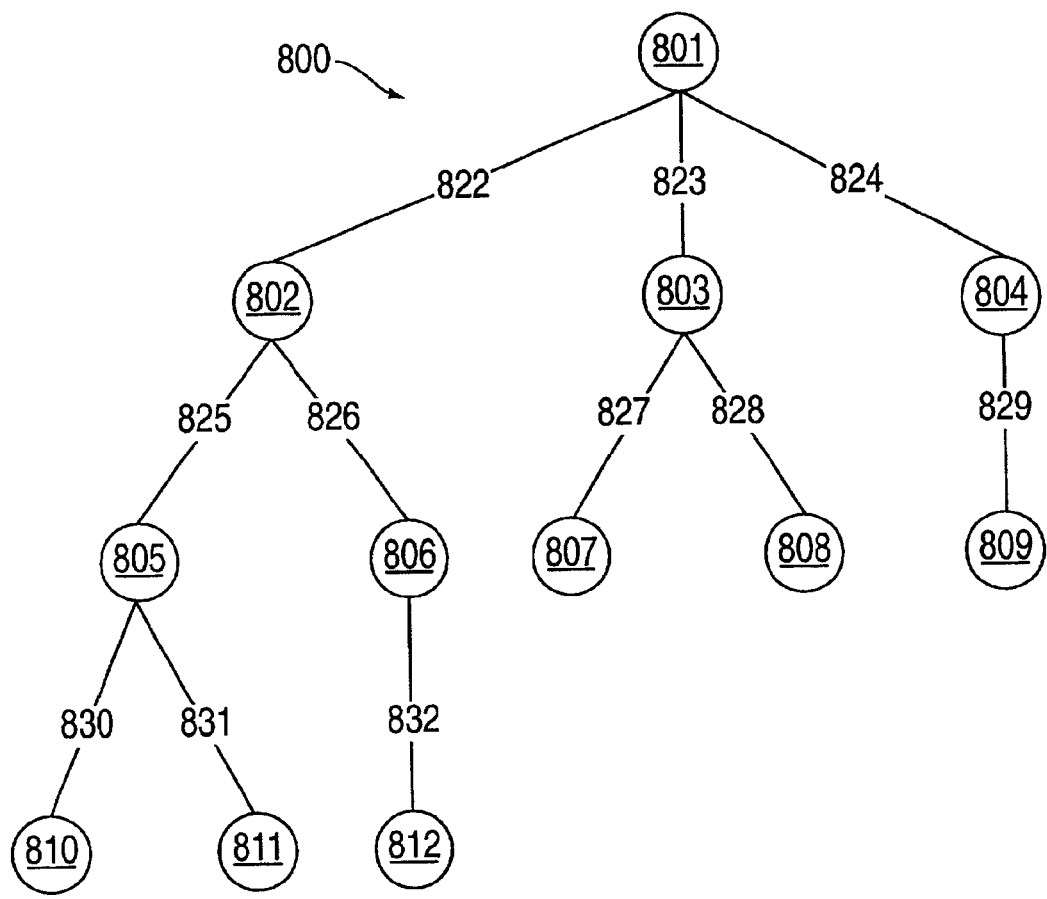
FIG. 8 is an illustration of a hierarchical data structure.

Hierarchical data structures are further explained with reference to FIG. 8. Hierarchical data structures can be used to represent solid models as combinations of geometry, topology, operations, transformations, assemblies, subassemblies, and other model data. These combinations of components can be represented by a collection of nodes 801–812 interconnected in ancestor-descendent relationships. A modeled object may be represented by a root node 801 and nodes 802–812 connected to the root node 801. The root node 801 is an ancestor of all the other nodes 802–812 of the modeled object. Correspondingly, all other nodes 802–812 are descendents of the root node 801. A "descendant" node is descended from a group of ancestor nodes that includes the root node 801, as well as all other nodes located on paths 822–832 connecting that descendent to the root node. For example, nodes 801, 802, and 805 are ancestors of descendent nodes 810 and 811, while the remaining nodes in the hierarchical data structure 800 are not ancestors of node 810 or node 811. Nodes that are directly interconnected have a particular type of ancestor-descendent relationship known as a parent-child relationship.

A hierarchical data structure 800 can be used to define relationships between modeled components. For example, node 810 may represent a front view of a model, node 811 may represent a cross-section view of a model, and their parent node 805 may represent a drawing sheet on which the views are drawn. Thus, node 805 defines a relationship between its descendents that results in the formation of an object that is a drawing sheet. Similarly, other nodes in the hierarchical data structure 800 define relationships between their descendents.

Modeling software can construct (or render) a modeled object by traversing ("walking") the nodes in the hierarchical data structure 800. Walking the nodes 801–812 can include performing a breadth-first or depth-first traversal of the nodes 801–812 to locate child nodes of any given parent. The model may then be constructed by performing the operations represented by the parent and child nodes.

In one embodiment, the underlying data structures that support automated 3D alternative views are not only hierarchical, but are also object oriented. In an object-oriented programming environment, a class defines a set of objects that have similar data structures, properties, and methods. Objects, which are instances of particular classes, form the nodes of the hierarchical data structure.

Figure 9:
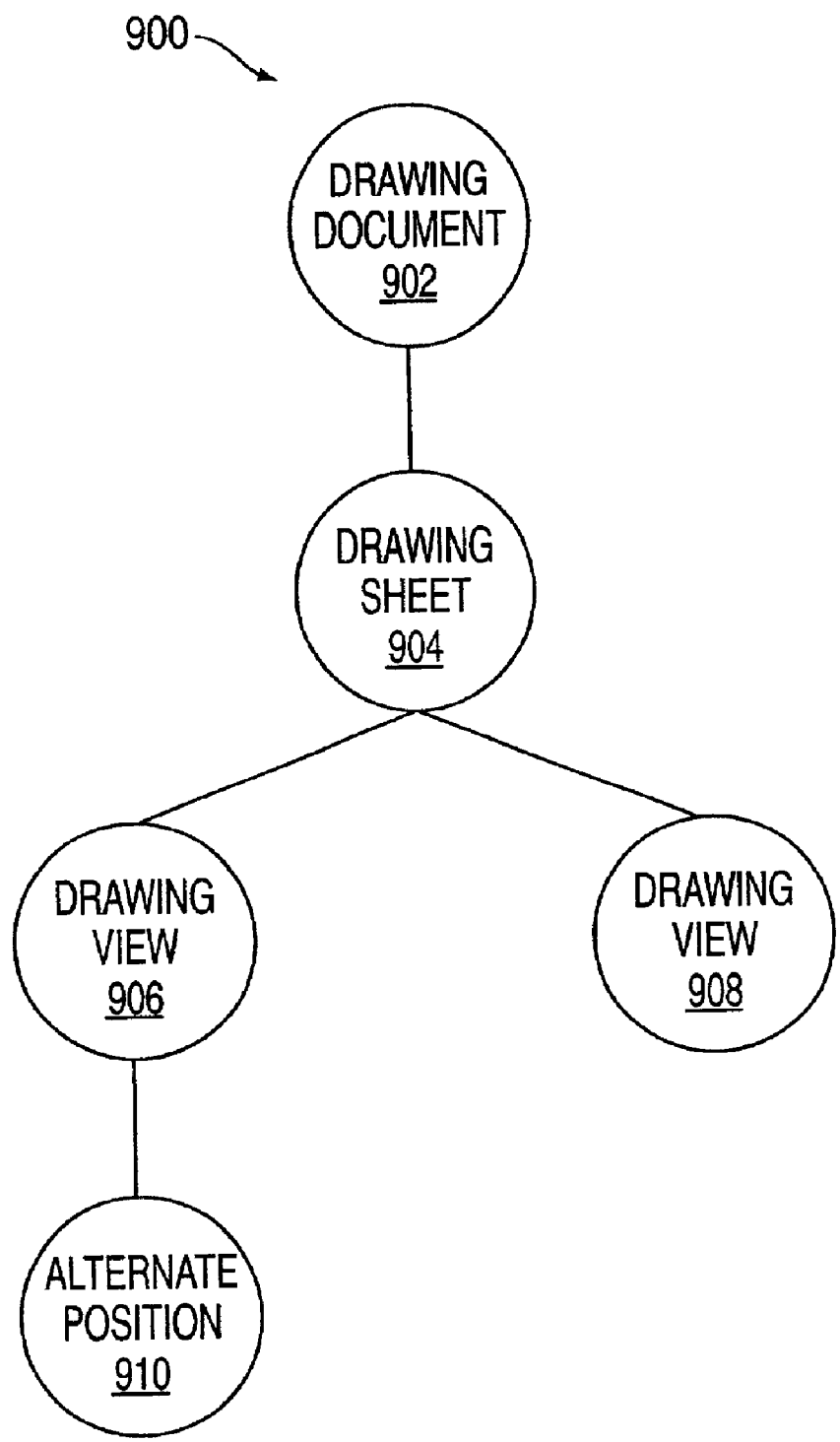
FIG. 9 is an illustration of a display data structure for a 2D drawing view.

FIG. 9 is an illustration of the object hierarchy that produces a 2D drawing 900. In the drafting module of the modeling system, an object 902 belonging to the drawing document class contains information that specifies if the document is a part (i.e., a detailed drawing), or an assembly. The drawing document object 902 can contain other information, such as a title block, as well as pointers to one or more drawing sheets.

The portion of a hierarchical data structure that produces the 2D drawing 900 as illustrated in FIG. 9, has only one drawing sheet object 904. However, any number of drawing sheet objects may be included in a hierarchical data structure. Drawing sheets serve the purpose of accommodating drawings that have numerous rendered drawing view areas. When the drawing contains more drawing view areas than one sheet can accommodate, the draftsman utilizes multiple drawing sheets.

Each drawing sheet can contain one or more 2D drawing view areas. Generally, drawing view areas are used to display different aspects of a model (e.g., a front view and a section view). In FIG. 9, the drawing sheet object 904 has two direct descendants, referenced by a pointer from drawing sheet object 904 to drawing view object 906 and a second pointer from drawing sheet object 904 to drawing view object 908.

An alternative position object displays similar behavior as the drawing view object that shares the same drawing space. For example, both objects may reference the same part or assembly and both objects may share the same border. Furthermore, the same scaling and other transformations may affect both objects, and deletion and other operations may be synchronized for both objects. Thus, the alternative position object 910 is placed as a child of the drawing view object 906. This ordering of parent and child objects enables the system to render alternative views of a model in the same drawing view area and permits the objects to share behavioral characteristics and attributes.

A derived class contains all the definitions of the class from which it is derived. However, the derived class may have additional properties and definitions, or may redefine existing properties and definitions. For example, a derived class that defines a section view may include an additional property that specifies a plane that slices the model at a specified location.

Figure 10:
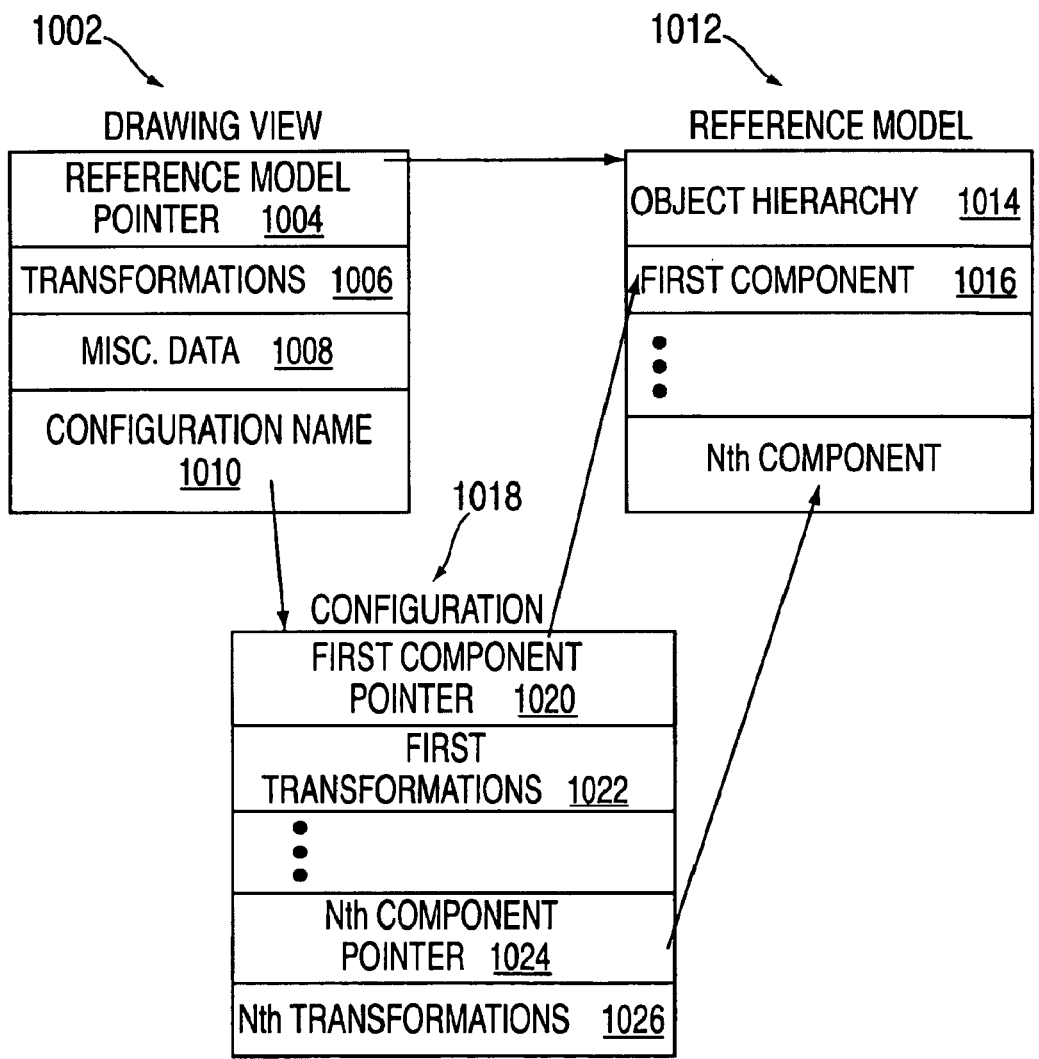
FIG. 10 is a diagram of object classes.

FIG. 10 is a diagram of a drawing view class 1002, a reference model class 1012, and a configuration class 1018. The drawing view class 1002 contains a reference model pointer 1004, a set of transformations 1006, miscellaneous data 1008, and a configuration name 1010, which may be implemented as a pointer. The reference model pointer 1004 is used to access the definition of the model that is rendered in the drawing view area. The transformations 1006 are applied to the reference model and are a factor in positioning the model in the drawing view area. The miscellaneous data 1008 conforms to a particular derived class, and therefore, the contents of the miscellaneous data 1008 depend on the representation of the model in the drawing view area. To illustrate, the miscellaneous data 1008 may contain a name that defines a particular orthographic view (e.g., "front"), may specify an area of the model to enlarge as a detailed view, or may specify a plane that defines a section of the model.

The reference model class 1012 defines all the model's features, including the model's object hierarchy 1014. The components in a reference model object, such as first component 1016, determine whether the reference model object defines a part or an assembly. If the reference model object contains only one component, then the reference model object defines a part; otherwise, the reference model object defines an assembly. The component data structure stored in the reference model object, such as first component 1016, may contain data that defines the component's geometry or may contain a pointer to another data structure that stores the data that defines the component's geometry.

The configuration name 1010 defined in the drawing view class 1002 may be an integer that identifies a configuration, or as illustrated, may be a pointer to an object that is a member of the configuration class 1018. The system may have created the configuration object when a design engineer was constructing the model or when a draftsman was creating 3D alternative positions utilizing the 3D-design module. An object that is a member of the configuration class 1018 contains pointers to components in a reference model object, such as the first component pointer 1020 and the Nth component pointer 1024. Transformations that reposition particular components, such as the first transformations 1022 and the Nth transformations 1026, are also included in the configuration class 1018. The component pointers and respective transformations specified by an object that is a member of the configuration class 1018 define the unique alternative position.

Figure 11:
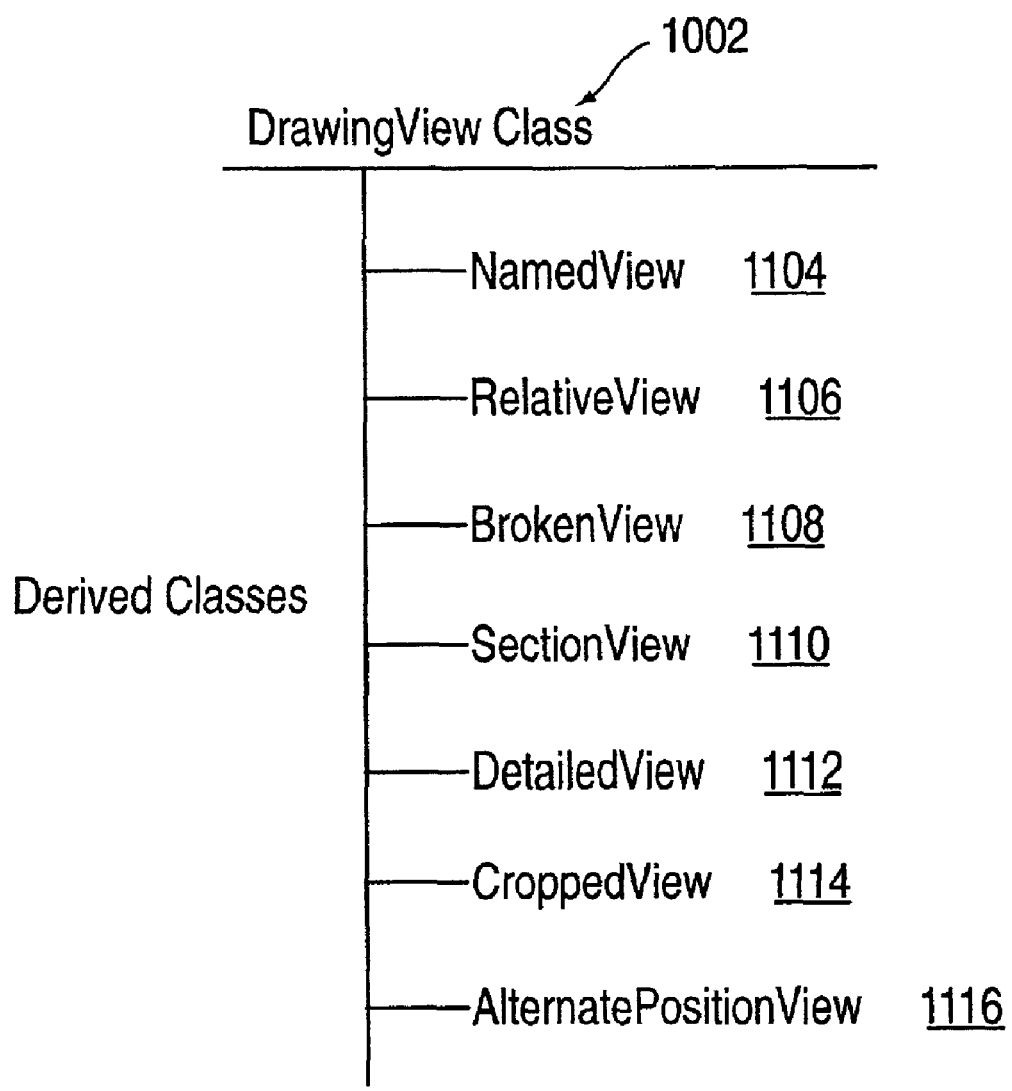
FIG. 11 is a diagram of derived classes.

FIG. 11 shows several derived classes of the drawing view class 1002. One drawing view derived class is the NamedView class 1104. A NamedView object is used to display standard orthographic views (e.g., front, top, or isometric), custom views, or a view of the current model. The draftsman selects a view name from a user interface dialog. The system interprets the selection, then creates the appropriate NamedView object. For example, if the draftsman selects the text string "Isometric" from a menu, the system generates an isometric view of the model having the x, y, and z axes each rotated by −45°.

An object that is a member of the RelativeView class 1106 is used to change the default orientation of a model in a drawing view area. The RelativeView object contains a transformation defined by two perpendicular faces in the model and specific orientations for each face. The transformation positions the model in the desired orientation.

An object that is a member of the BrokenView class 1108 is used to remove a portion of a model for display purposes only. For example, if a model were exceptionally wide and rendering the center of the model would not add any useful knowledge to the drawing, the draftsman may prefer to show only the far ends of the model. The area removed in a broken view is the area between two specified planes.

The SectionView class 1110, the DetailView class 1112, and the CroppedView class 1114 are among other drawing view derived classes. A SectionView object defines a cross-section of a model. A DetailView object defines an area in a model and a scaling transformation to enlarge the area in the model. A CroppedView object defines a portion of a model that is displayed, but does not enlarge the area.

With the exception of the AlternatePositionView class 1116, all objects that may be instances of a drawing view derived class are placed in the object hierarchy as direct descendents of a drawing sheet object (as illustrated in FIG. 9). When present, an AlternatePositionView object adds another level of depth to the hierarchical data structure because an AlternatePositionView object is a direct descendent of another object that is an instance of a drawing view derived class, as discussed with reference to FIG. 9.

In one embodiment, an AlternatePositionView object contains data that is duplicated from its parent drawing view object. The AlternatePositionView object may also inherit values for miscellaneous data stored in the parent drawing view object. However, the AlternatePositionView object and the parent object of the AlternatePositionView object have two significant differences.

The first significant difference is that the AlternatePositionView object and the parent object of the AlternatePositionView object reference different configurations. The configurations specify alternative positions for the components in the same reference model. As discussed, the configuration referenced by the AlternatePositionView may be created by a design engineer during the 3D modeling process or by a draftsman while preparing a formal drawing.

The second significant difference is that the system renders the configurations using different line fonts. The draftsman may select any line style including the industry standard line style for distinguishing alternative positions, which is known as a "phantom" line font and is a thin chain line that has double dashes (i.e.,
The line font is stored in the AlternatePositionView object's data structure.

Parametric dimensions may be added between the same or between different components that are displayed in alternative positions within the same 2D drawing view area. Additionally, the system allows for cross-view dimensions to annotate components that are displayed in different drawing view areas. Cross-view dimensions may be created irrespective of whether the components belong to alternative positions.

After the alternative positions are rendered in the same, or possibly, different 2D drawing view areas, dimensions may be attached to entities in the alternative positions, for example, to document a component's range of motion. The entities that may be dimensioned, also referred to hereinafter as dimensional entities, include points, edges, faces, vertices, and items sketched in the drawing view area.

The dimensions are parametric, and therefore, the system can update the dimensions in real time so that dimension lines that show what is being measured and dimension text that specifies the measured quantity are always correct. The system can automatically update the relevant dimensions if the design engineer modifies the model or if the draftsman modifies the underlying configuration thereby causing one of the alternative positions to move relative to another alternative position.

Figure 12:
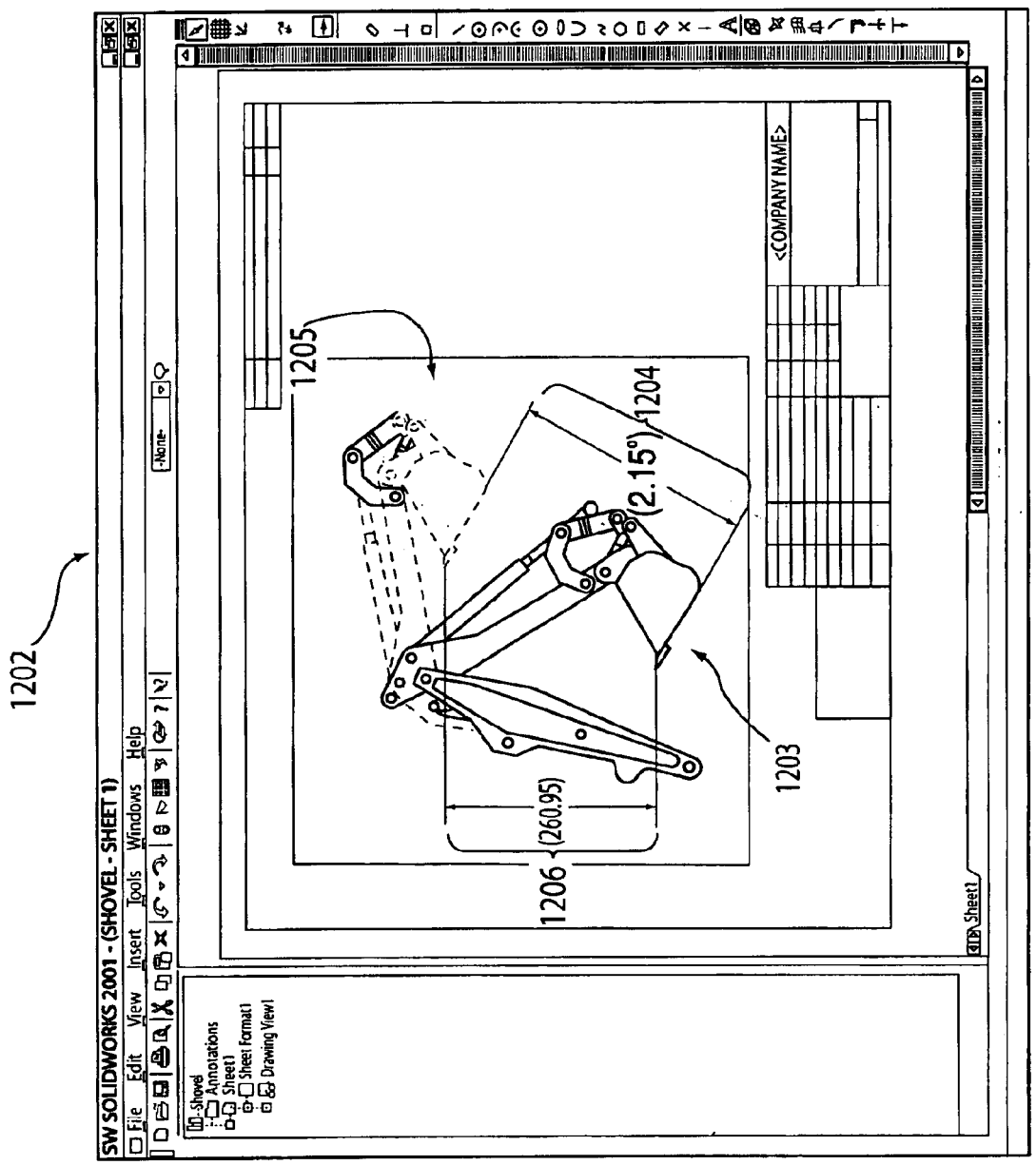
FIG. 12 is an illustration of rendered dimensions.

FIG. 12 shows alternative views of a shovel displayed in a window 1202. The initial position 1203 of the shovel is rendered using solid lines. Components of the shovel that are displayed in a second position 1205 are rendered using the phantom line font. Two dimensions are also rendered in window 1202. The first dimension 1206 is a measurement of the vertical distance between the inside tip of the shovel in the initial position 1203 and the inside tip of the shovel in the second position 1205. The second dimension 1204 is a measurement of the angle through which the open end of the shovel may travel.

Figure 13:
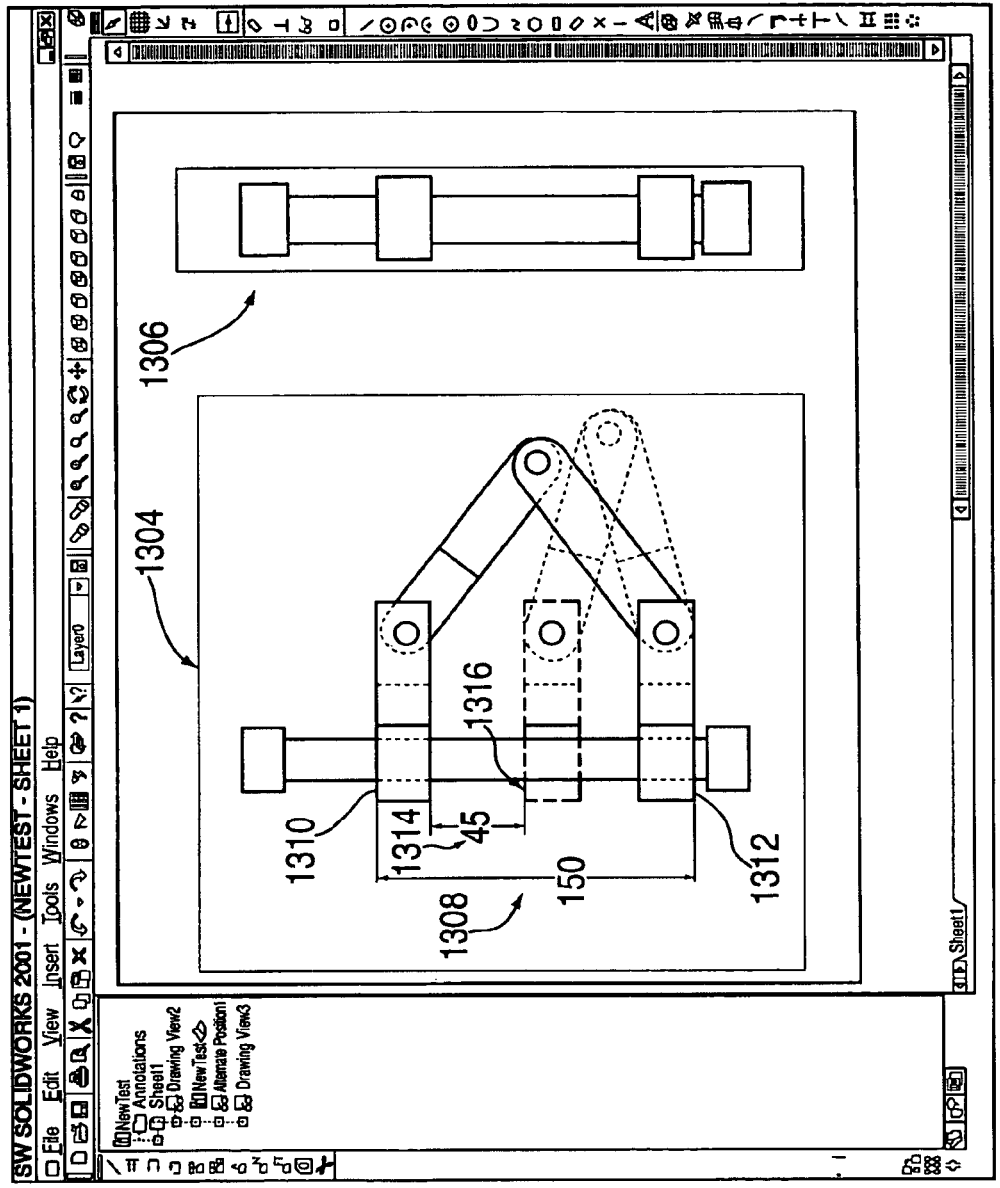
FIG. 13 is an illustration of rendered dimensions.

Referring now to FIG. 13, a window 1302 contains two drawing view areas. Two positions of the same model are displayed in the left drawing view area 1304 and one position of the model is displayed in the right drawing view area 1306. A first dimension 1308 annotates the vertical distance between the top of the upper slider in the initial position 1310 and the bottom of the lower slider 1312. A second dimension 1314 annotates the vertical distance between the bottom of the upper slider in the initial position 1310 and the top of the upper slider in an alternative position 1316.

In one embodiment, dimensioning between alternative positions is implemented by storing the dimension data within the object hierarchy that produces a 2D drawing. For dimensional entities that are contained in the same drawing view area, the dimension data is stored in the drawing view object that is the parent of the alternate position object. For dimensional entities that are contained in separate drawing view areas, the dimension data is stored in the drawing sheet object that is the parent object of the drawing view objects that specify the boundaries of the separate drawing view areas.

The dimension is stored as a data structure that contains references (e.g., pointers) to one or more dimensional entities. In addition to references to the entities being dimensioned, the dimension data structure contains reference chains that specify the mapping into 2D drawing space of the entities being dimensioned. A reference chain defines a series of references to the component, model, and drawing view in which the entity belongs. Each reference in the series includes a transformation, a pointer to that which is referenced (e.g., component, model, or drawing view object), and a pointer to the next reference in the reference chain (i.e., a next pointer).

Figure 14:
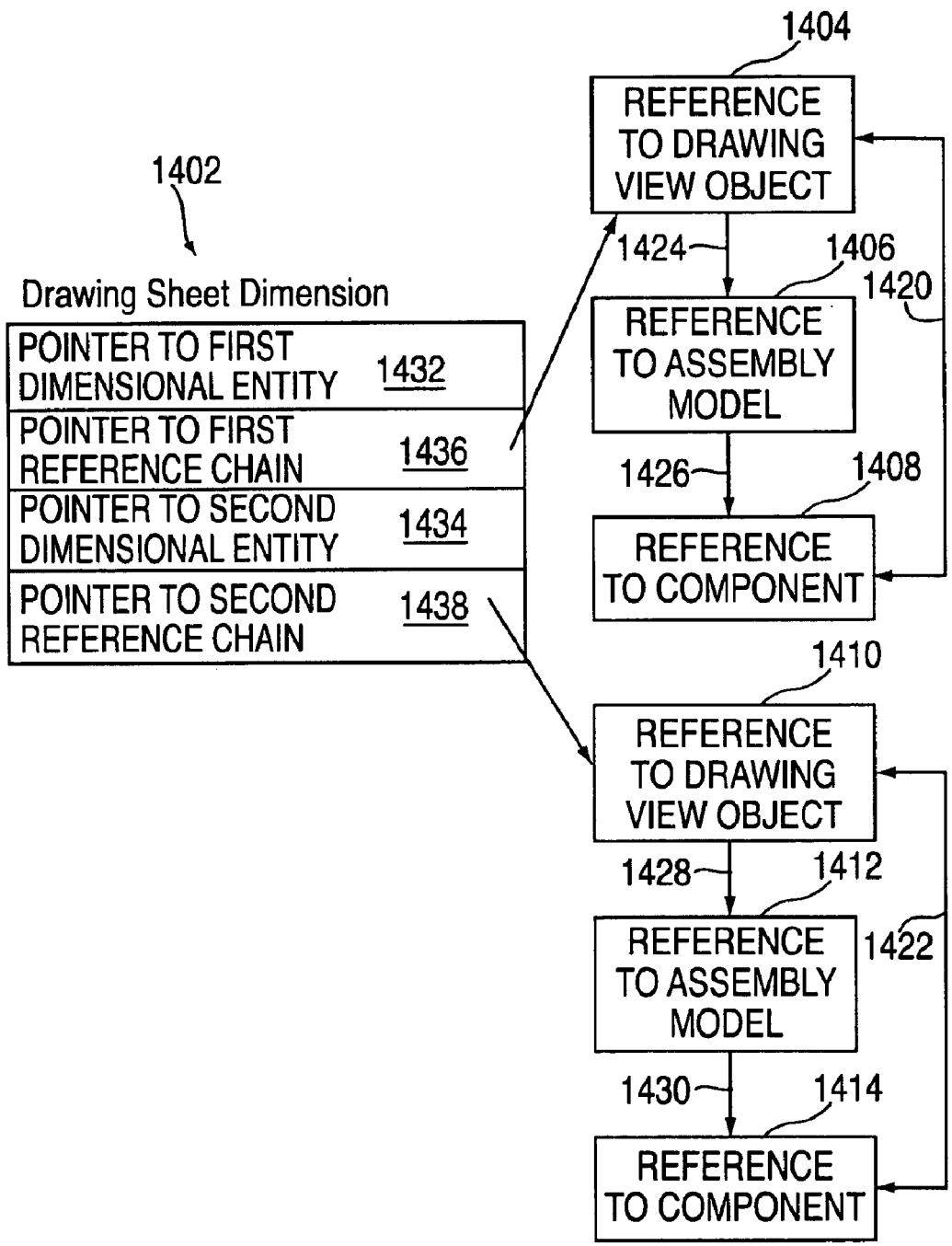
FIG. 14 is a representation of a dimension.

FIG. 14 illustrates a representation of a dimension 1402. The dimension 1402 is stored in a drawing sheet object (not shown), and therefore, dimensional entities are rendered in separate drawing view areas. The dimension 1402 has a pointer to a first dimensional entity 1432, a pointer to a second dimensional entity 1434, a pointer to a first reference chain 1436, and a pointer to a second reference chain 1438.

The first reference chain 1420 includes a reference to a drawing view object 1404 that contains a next pointer 1424 to a reference to an assembly model 1406. The reference to the assembly model 1406 contains a next pointer 1426 to a reference to a component 1408. The second reference chain 1422 includes a reference to a drawing view object 1410 that contains a next pointer 1428 to a reference to an assembly model 1412. The reference to the assembly model 1412 (which may refer to the same model as that referenced by the reference to an assembly model 1406 in the first reference chain 1420), contains a next pointer 1430 to a reference to a component 1414.

A dimension is generated for one or more dimensional entities, which may be in the same or different models. The pointer to the first dimensional entity 1432 belongs to the component referred to by the reference to a component 1408 in the first reference chain 1420. The pointer to the second dimensional entity 1434 belongs to the component referred to by the reference to a component 1414 in the second reference chain 1422. In this illustration, the dimension data is stored in a drawing sheet object because the dimensional entities are rendered in separate drawing view areas. However, if the entities are displayed in the same drawing view area, the dimension would be stored as part of a drawing view object.

As previously mentioned each reference in a reference chain 1404–1414 contains a transformation. Taken together, the transformations stored in the reference chain produce a mapping from a component space to the coordinate space of the drawing view area or the coordinate space of the drawing sheet, depending on whether the dimensional entities are in the same or different drawing views. A reference to a component stores a transformation that accounts for the position of the component in the assembly model. A reference to an assembly model stores a transformation that maps the model into a drawing view object. A reference to a drawing view object stores a transformation that maps the drawing view area onto a drawing sheet.

The transformations that are stored in each reference in a reference chain 1404–1414 are all concatenated together. First, the transformation stored with the reference to the component is multiplied by the transformation stored with the reference to the assembly model, then the result is multiplied by the transformation stored with the reference to the drawing view object. The dimensional entities are then multiplied with the concatenated transformation. This operation has the affect of representing the dimensional entities within the same geometric space, thereby permitting the dimension value to be correctly calculated and the dimension lines and text to be correctly rendered.

The dimensions are connected to lines, arcs, points, and other geometric elements at locations on the components referred to as "attachment points." The attachment points may be explicitly selected by a draftsman or may be automatically determined by the system after a draftsman selects an entity such as an edge or face.

Generally, existing CAD and modeling systems represent dimensions within the same assembly component or between one component and another component within the same assembly. The present invention calculates the correct attachment points in the drawing sheet space or drawing view space, and calculates the correct value for a dimension between entities rendered in alternative positions. Additionally, by introducing the drawing sheet object as another coordinate space in which to transform the dimensional entities, a cross-view dimension may be created.

Figure 15:
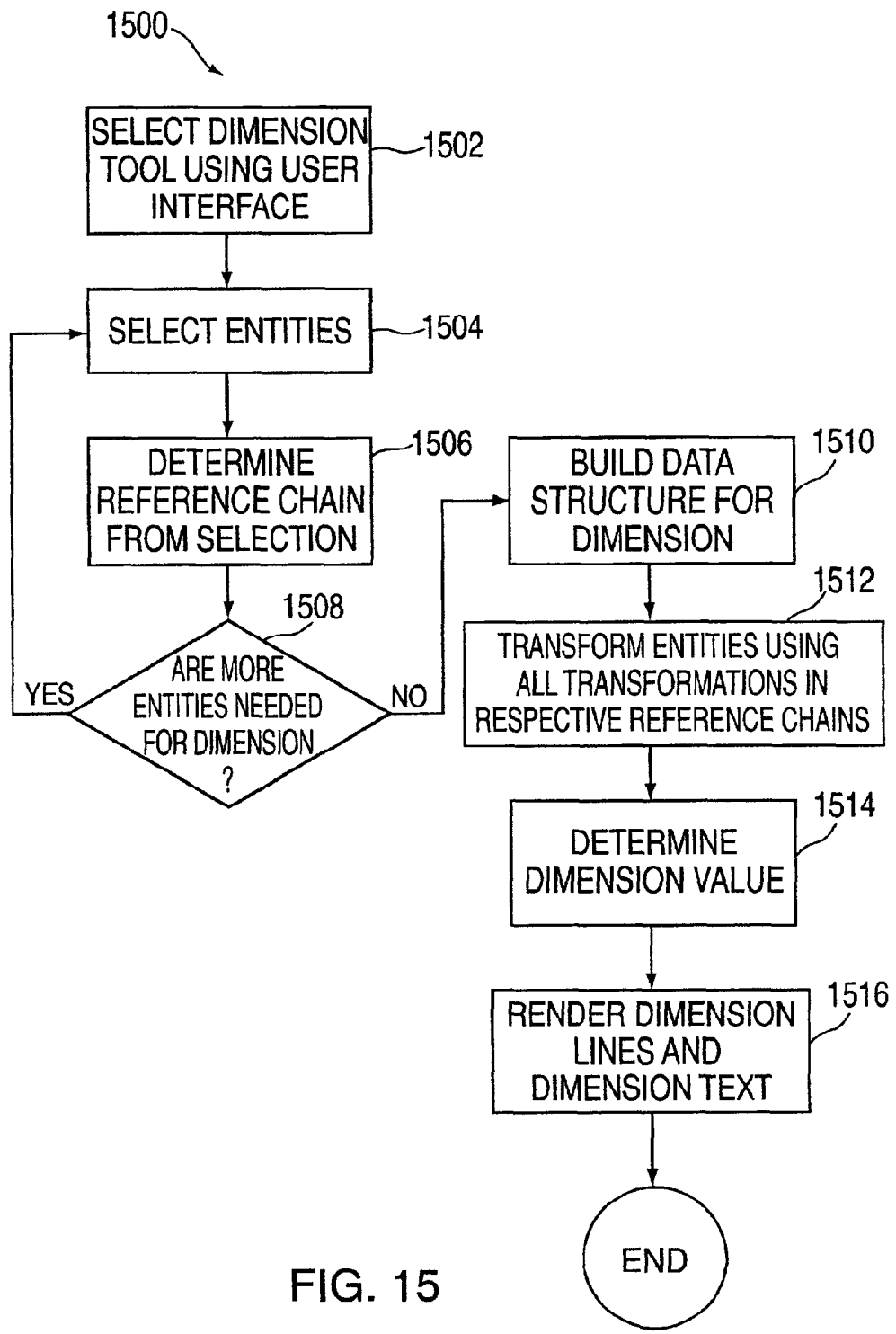
FIG. 15 is a flow chart of a procedure to create a dimension.

Referring to FIG. 15, a procedure 1500 that produces a dimension between entities in alternative positions begins when the draftsman selects a dimension tool using the user interface (step 1502). The draftsman then selects one or more entities to dimension (step 1504). The procedure 1500 determines the reference chain for the selected entity (step 1506) by, for example, traversing the hierarchical data structure for the purpose of gathering the relevant transformations and creating pointers to the appropriate ancestor objects of the selected entity.

Depending on the type of dimension being created, the system may need the draftsman to select one or more dimensional entities. For example, a radial dimension is attached to one entity, a linear dimension is attached to one or two entities, and an angular dimension is attached to two or three entities. The procedure 1500 determines whether the required number of entities have been selected to create a dimension (step 1508). The draftsman may need to select another entity, in which case the procedure 1500 enables the draftsman to select another entity (step 1504) and then determines the reference chain from the selection (step 1506).

After the number of entities required by the type of dimension are selected, the procedure 1500 generates a data structure that defines the dimension (step 1510), such as that discussed with reference to FIG. 14. The entities are then transformed to the drawing view space or drawing sheet space, whichever applies, using all transformations stored in all the references in the entities' respective reference chains (step 1512). The dimension value is determined from the positions of the dimensional entities in the appropriate coordinate space, that is, the drawing view object's space or drawing sheet object's space (step 1514). Two-dimensional points (P0, P0, . . . Pn) are calculated and used to generate the dimension lines. The dimension is then displayed in a default location with respect to the dimensional entities or in a location determined by the current cursor location positioned by the draftsman. The dimension is rendered as text and dimension lines positioned at P0 through Pn (step 1516).

The invention may be implemented in digital electronic circuitry, or in computer hardware, firmware, software, or in combinations thereof. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

A number of embodiments of the present invention have been described. Nevertheless, it will be understood that various modifications may be made without departing from the spirit and scope of the invention. For example, in addition to configurations that represent alternative positions of one or more components, configurations may be models of design variations, which depict exchangeable parts that can vary in shape or size. A configuration may also be used to show a mold containing a part as one "position," and as the second "position," only the part translated to the side of the first "position." Furthermore, the alternative positions may be generated from separate models.

Implementations may change the order in which operations are performed. For example, in FIG. 6, operation 612 may be performed immediately after operation 614 and then followed by operation 616. Depending on the needs of an implementation, particular operations described herein may be implemented as a combined operation, eliminated, added to, or otherwise rearranged. Accordingly, other embodiments are within the scope of the following claims.

What is claimed is:

1. A computer-implemented method of processing a three-dimensional model of an object, the model comprising a plurality of model components, and the method comprising:

constructing a data structure identifying different positional arrangements of the model components to represent different positions of movable ones of the model components;

based on the data structure identifying the different positional arrangements, automatically generating an image of the model depicting a change in a position of a first one of the model components with respect to a second one of the model components; and wherein:

generating the image comprises traversing a model hierarchy to render the image of the model, the model hierarchy comprising an interrelationship of the plurality of model components, and the image depicting the object having the model components in a first and in a second positional arrangement;

the model hierarchy further comprises data representing different positional arrangements as defined during a model design process;

traversing the model hierarchy to render the image comprises rendering the image based on the data representing the different positional arrangements; and generating the image further comprises:
  depicting a first component in both a first and a second position;
  rendering the image in a view area; and
  generating an annotation showing a dimension between a first entity in the first position and the first entity in the second position.

2. The method of claim 1, further comprising:
altering the model of the object;
updating the annotation to correspond to the model of the object as altered; and
rendering an updated annotation value and an updated annotation line.

3. The method of claim 1, wherein different display attributes are applied to depict the first component in the first position than are applied to depict the first component in the second position.

4. The method of claim 3, wherein the display attributes comprise attributes selected from the group consisting of color, line weight, and line pattern.

5. The method of claim 1, wherein a solid line font depicts the first component in the first position and a phantom line font depicts the first component in the second position.

6. A computer-implemented method of processing data representing a three-dimensional object model, the method comprising:

traversing a model hierarchy to render a first view of a model, the model hierarchy comprising an interrelationship of a plurality of model components, the plurality of model components having a first positional arrangement with respect to each other, and the first view depicting the first positional arrangement of the plurality of model components;

traversing a positionally altered version of the model hierarchy to render a second view of the model, the positionally altered version comprising the plurality of model components in a second positional arrangement with respect to each other, the second positional arrangement differing from the first positional arrangement, and the second view depicting the second positional arrangement of the plurality of model components;

combining the first view and the second view to display a composite image of the model, the composite image simultaneously representing both the first and the second positional arrangements; and wherein:
  the model hierarchy comprises a first position indicating data structure detailing a first position of a first one of the model components with respect to other ones of the model components and a second position indicating data structure specifying a different position of the first one of the model components with respect to the other ones of the model components;
  traversing to render the first view comprises rendering the first model component to depict the first model component in a position specified by the first position indicating data structure; and
  traversing to render the second view comprises rendering the first model component to depict the first model component in a position specified by the second position indicating data structure.

7. The method of claim 6, wherein:
the first and the second positional arrangements each comprise a same first subset of model components that have a same layout in both the first and second positional arrangements; and
the first and the second positional arrangements each comprise a second subset of model components that have a first layout in the first positional arrangement that differs from a second layout in the second positional arrangement.

8. The method of claim 7, wherein:
the composite image comprises a single representation of the first subset of model components and a first and second representations of the second subset of model components, the first representation distinguishing the first positional arrangement of the second subset and the second representation distinguishing the second positional arrangement of the second subset.

9. The method of claim 7, wherein differing display attributes distinguish change in positional arrangement of the second subset of model components.

10. The method of claim 9, wherein display attributes comprise line style attributes selected from a group consisting of color, line weight, and line pattern.

11. The method of claim 6, wherein the positionally altered version of the model hierarchy is generated during preparation of a formal drawing of the model.

12. The method of claim 11, wherein preparation of a formal drawing comprises:
  a computer-aided design drafting process transferring control from a two-dimensional computer-aided design module to a three-dimensional computer-aided design module;
  the three-dimensional computer-aided design module displaying a software modeling tool, the modeling tool capable of initiating a creation of the second positional arrangement;
  the creation of the second positional arrangement comprising:
    creating a data structure to define the second positional arrangement; and
    storing a three-dimensional transformation in the data structure;
  the computer-aided design drafting process transferring control from the three-dimensional computer-aided design module to the two-dimensional computer-aided design module after the creation of the second positional arrangement completes; and
  the computer-aided design drafting process projecting the second positional arrangement in a two-dimensional drafting window.

13. The method of claim 12, wherein:
the three-dimensional transformation is applied to the model during the computer-aided design drafting process to produce the second positional arrangement; and
the second positional arrangement appears in the two-dimensional drafting window as the three-dimensional transformation is being applied.

14. The method of claim 12, wherein the two-dimensional computer-aided design module and the three-dimensional computer-aided design module comprise parametric operations.

15. A computer-implemented method of processing data representing a three-dimensional object model, the method comprising:

traversing a model hierarchy to render a first view of a model, the model hierarchy comprising an interrelationship of a plurality of model components, the plurality of model components having a first positional arrangement with respect to each other, and the first view depicting the first positional arrangement of the plurality of model components;

traversing a positionally altered version of the model hierarchy to render a second view of the model, the positionally altered version comprising the plurality of model components in a second positional arrangement with respect to each other, the second positional arrangement differing from the first positional arrangement, and the second view depicting the second positional arrangement of the plurality of model components;

combining the first view and the second view to display a composite image of the model, the composite image simultaneously representing both the first and the second positional arrangements;

storing a dimension datum in the model hierarchy, the dimension datum referring to a first view entity and a second view entity;

processing the dimension datum, the processing comprising calculating a mapping of the first view entity and the second view entity to a common coordinate space; and rendering a dimension value and a dimension line in the composite image.

16. The method of claim 15, further comprising:

updating the dimension datum after altering one of the model components; and rendering an updated dimension value and an updated dimension line.

17. The method of claim 16, wherein the dimension datum behaves parametrically.

18. A computing system for processing data representing construction of a three-dimensional object, the system comprising:

a model data storage system comprising stored model data representing construction of a three-dimensional object from a plurality of modeled components;

a computer processor coupled to the model data storage system, a program storage system, and an output display system, the program storage system comprising instructions to configure the processor to:

retrieve the stored model data from the model data storage system;

render a first view of the three-dimensional object in which the plurality of modeled components are in a first positional arrangement;

render a second view of the three-dimensional object in which the plurality of modeled components are in a second positional arrangement that is different from the first positional arrangement;

automatically display an overlaid view of the first and the second views on the output display system, the overlaid view distinguishing a change between the first and the second positional arrangements of the modeled components; and wherein:

the plurality of modeled components comprise a first and a second modeled component having a different positional arrangement with respect to each other in the first and second views;

the instructions to display the overlaid view comprise instructions to display the first modeled component at a common position on the output display and to display the second modeled component at different positions on the output display to distinguish a change in positional arrangement of the second model component with respect to the first modeled component; and the program storage system further comprises instructions to configure the computer processor to calculate a dimension between a first entity in the first view and the first entity or a second entity in the second view.

19. The computing system of claim 18, wherein the stored model data represents construction of the three-dimensional object based on a hierarchical relationship between the plurality of modeled components.

20. The computing system of claim 19, wherein:

the instructions to render the first and the second views comprise instructions to render in accordance with the hierarchical relationship.

21. The computing system of claim 18, wherein the output display system comprises a system selected from the group consisting of a video display, a plotter, and a printer.

22. A computing system for processing data representing construction of a three-dimensional object, the system comprising:

a model data storage system comprising stored model data representing construction of a three-dimensional object from a plurality of modeled components;

a computer processor coupled to the model data storage system, a program storage system, and an output display system, the program storage system comprising instructions to configure the processor to:

retrieve the stored model data from the model data storage system;

render a first view of the three-dimensional object in which the plurality of modeled components are in a first positional arrangement;

render a second view of the three-dimensional object in which the plurality of modeled components are in a second positional arrangement that is different from the first positional arrangement; and automatically display an overlaid view of the first and the second views on the output display system, the overlaid view distinguishing a change between the first and the second positional arrangements of the modeled components;

configure the computer processor to modify the stored model data; and update the stored model data.

23. A data storage apparatus comprising instructions to configure a computer to:

traverse a model hierarchy to render a first view of a model, the model hierarchy comprising an interrelationship of a plurality of model components, the plurality of model components having a first positional arrangement with respect to each other, and the first view depicting the first positional arrangement of the plurality of model components;

traverse a positionally altered version of the model hierarchy to render a second view of the model, the positionally altered version comprising the plurality of model components in a second positional arrangement with respect to each other, the second positional arrangement differing from the first positional arrangement, and the second view depicting the second positional arrangement of the plurality of model components;

combine the first view and the second view to display a composite image of the model, the composite image simultaneously representing both the first and the second positional arrangements; and wherein:

the model hierarchy comprises a first position indicating data structure detailing a first position of a first one of the model components with respect to other ones of the model components and a second position indicating data structure specifying a different position of the first one of the model components with respect to the other ones of the model components;

traversing to render the first view comprises rendering the first model component to depict the first model component in a position specified by the first position indicating data structure; and traversing to render the second view comprises rendering the first model component to depict the first model component in a position specified by the second position indicating data structure.

24. The apparatus of claim 23, wherein:

the first and the second positional arrangements each comprise a same first subset of model components that have a same layout in both the first and second positional arrangements; and the first and the second positional arrangements each comprise a second subset of model components that have a first layout in the first positional arrangement that differs from a second layout in the second positional arrangement.

* * * * *